(12) United States Patent
Shen

(10) Patent No.: US 7,567,112 B2
(45) Date of Patent: Jul. 28, 2009

(54) VOLTAGE LEVEL SHIFTER AND METHOD THEREOF

(75) Inventor: Hung-Hao Shen, Taipei (TW)

(73) Assignee: Via Technologies, Inc., Taipei (TW)

( * ) Notice: Subject to any disclaimer, the term of this patent is extended or adjusted under 35 U.S.C. 154(b) by 17 days.

(21) Appl. No.: 11/924,965

(22) Filed: Oct. 26, 2007

(65) Prior Publication Data

US 2008/0111609 A1    May 15, 2008

(30) Foreign Application Priority Data

Nov. 14, 2006   (TW)  .............................. 95142023 A

(51) Int. Cl.
   *H03L 5/00*   (2006.01)

(52) U.S. Cl. ............................. 327/333; 326/80; 326/81

(58) Field of Classification Search ................. 327/333; 326/80, 81
See application file for complete search history.

(56) References Cited

U.S. PATENT DOCUMENTS

| 5,396,128 | A | * | 3/1995 | Dunning et al. | ................ 326/68 |
| 5,736,869 | A | * | 4/1998 | Wei | .............................. 326/81 |
| 5,933,025 | A | * | 8/1999 | Nance et al. | ................... 326/81 |
| 6,946,893 | B2 | * | 9/2005 | Hayashi et al. | .............. 327/333 |
| 6,985,022 | B2 | * | 1/2006 | Kanno et al. | ................. 327/333 |
| 7,368,970 | B2 | * | 5/2008 | Lin et al. | ..................... 327/333 |

* cited by examiner

*Primary Examiner*—Kenneth B. Wells
(74) *Attorney, Agent, or Firm*—Thomas, Kayden, Horstemeyer & Risley

(57) ABSTRACT

A voltage level shifter converts an input signal into an output signal. While the input signal is high to the output signal is high either. Moreover, while the input signal is low the output signal is low either.

13 Claims, 2 Drawing Sheets

VOLTAGE LEVEL SHIFTER AND METHOD THEREOF

BACKGROUND OF THE INVENTION

1. Field of the Invention

The invention relates to a voltage level shifter, and in particular relates to a voltage level shifter avoiding current leakage.

2. Description of the Prior Art

Referring to FIG. 1, a schematic diagram of conventional voltage level shifter 100 is shown. Conventional voltage level shifter 100 includes: a inverting module 110, a latch circuit 140, inverting circuits 160 and 180 and an output circuit 195. Inverting module 110 includes NMOS transistors 111 and 112 and a PMOS transistor 113. NMOS transistor 111 has a drain for receiving an input signal Vin, a gate for receiving a voltage source $V_{DD}$ and a source coupled to ground voltage. NMOS transistor 112 has a drain coupled to node 121, a gate for receiving the input signal Vin and a source coupled to ground voltage. PMOS transistor 113 has a drain coupled to node 121, a gate for receiving the input signal Vin and a source for receiving the voltage source $V_{DD}$.

Inverting circuit 160 includes NMOS transistors 161, 163, 164 and 165 and a PMOS transistor 162. NMOS transistor 161 has a drain coupled to the gate of NMOS transistor 163, a gate for receiving the input signal Vin and a source coupled to ground voltage. NMOS transistor 163 has a drain coupled to NMOS transistor 164, a gate coupled to NMOS transistor 161 and a source coupled to ground voltage. NMOS transistor 164 has a drain coupled to NMOS transistor 165, a gate for receiving the voltage source $V_{DD}$ and a source coupled to NMOS transistor 164. NMOS transistor 165 has a drain coupled to node N1, a gate for receiving a voltage source $V_{BAT}$ and a source coupled to NMOS transistor 164. PMOS transistor 162 has a drain coupled to NMOS transistor 161, a gate for receiving the input signal Vin and a source for receive the voltage source $V_{DD}$. Voltage source $V_{DD}$ is generated from the voltage source $V_{BAT}$ by voltage dividing.

Inverting circuit 180 includes NMOS transistors 181, 183, 184 and 185 and a PMOS transistor 182. NMOS transistor 181 has a drain coupled to a gate of NMOS transistor 183, a gate coupled to node 121 and a source coupled to ground voltage. NMOS transistor 183 has a drain coupled to NMOS transistor 184, a gate coupled to NMOS transistor 181 and a source coupled to ground voltage. NMOS transistor 184 has a drain coupled to NMOS transistor 185, a gate coupled to the voltage source $V_{DD}$ and a source coupled to NMOS transistor 183. NMOS transistor 185 has a drain coupled to node N2, a gate coupled to the voltage source $V_{BAT}$ and a source coupled to NMOS transistor 184. PMOS transistor 182 has a drain coupled to NMOS transistor 181, a gate coupled to node 121 and a source for receiving the voltage source $V_{DD}$.

Latch circuit 140 includes PMOS transistors 141 and 142. PMOS transistor 141 has a drain coupled to node N1, a gate coupled to node N2 and a source coupled to the voltage source $V_{BAT}$. PMOS transistor 142 has a drain coupled to node N2, a gate coupled to node N1 and a source coupled to the voltage source $V_{BAT}$. Output circuit 195 includes inverters 196 and 197. Inverter 196 is coupled between the voltage sources $V_{BAT}$ and $V_{SS}$ and has an input terminal coupled to node N1 and an output terminal coupled to inverter 197. Inverter 197 is also coupled between the voltage source $V_{BAT}$ and ground voltage and has an input terminal coupled to inverter 196 and an output terminal for outputting an output signal Vout.

Conventional voltage level shifter 100 can be used in logic circuits of a computer system. While the computer system does not provide voltage source $V_{DD}$ or voltage source $V_{DD}$ is low, inverters 196 and 197 have leakage current due to node N1 of voltage level shifter 100 is floating connected.

BRIEF SUMMARY OF THE INVENTION

A detailed description is given in the following embodiments with reference to the accompanying drawings.

An embodiment of a voltage level shifter is provided. The voltage level shifter for converting an input signal into an output signal includes: a first inverting module coupled between an input terminal and a first node for receiving an external signal and the input signal from the input terminal and providing a first signal at the first node; a second inverting module coupled between the first node and a second node for receiving the external signal and the input signal and providing the first signal at the first node; a first inverting protection circuit coupled between the first node and a third node for receiving the first signal and providing a second signal at the third node; a second inverting protection circuit coupled between the second node and a fourth node for receiving the input signal and providing a third signal at the fourth node; a latch circuit coupled between the third node and the fourth node for receiving the second signal, the third signal; and an output circuit receiving the second signal and outputting the output signal according to the second signal.

Another embodiment of a voltage shifting method is provided. The voltage shifting method for converting an input signal into an output signal includes: outputting a first signal according to the input signal and an external signal; generating a second signal according to the first signal; generating a third signal according to the input signal; generating the output signal according to the second signal and the third signal.

BRIEF DESCRIPTION OF the DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
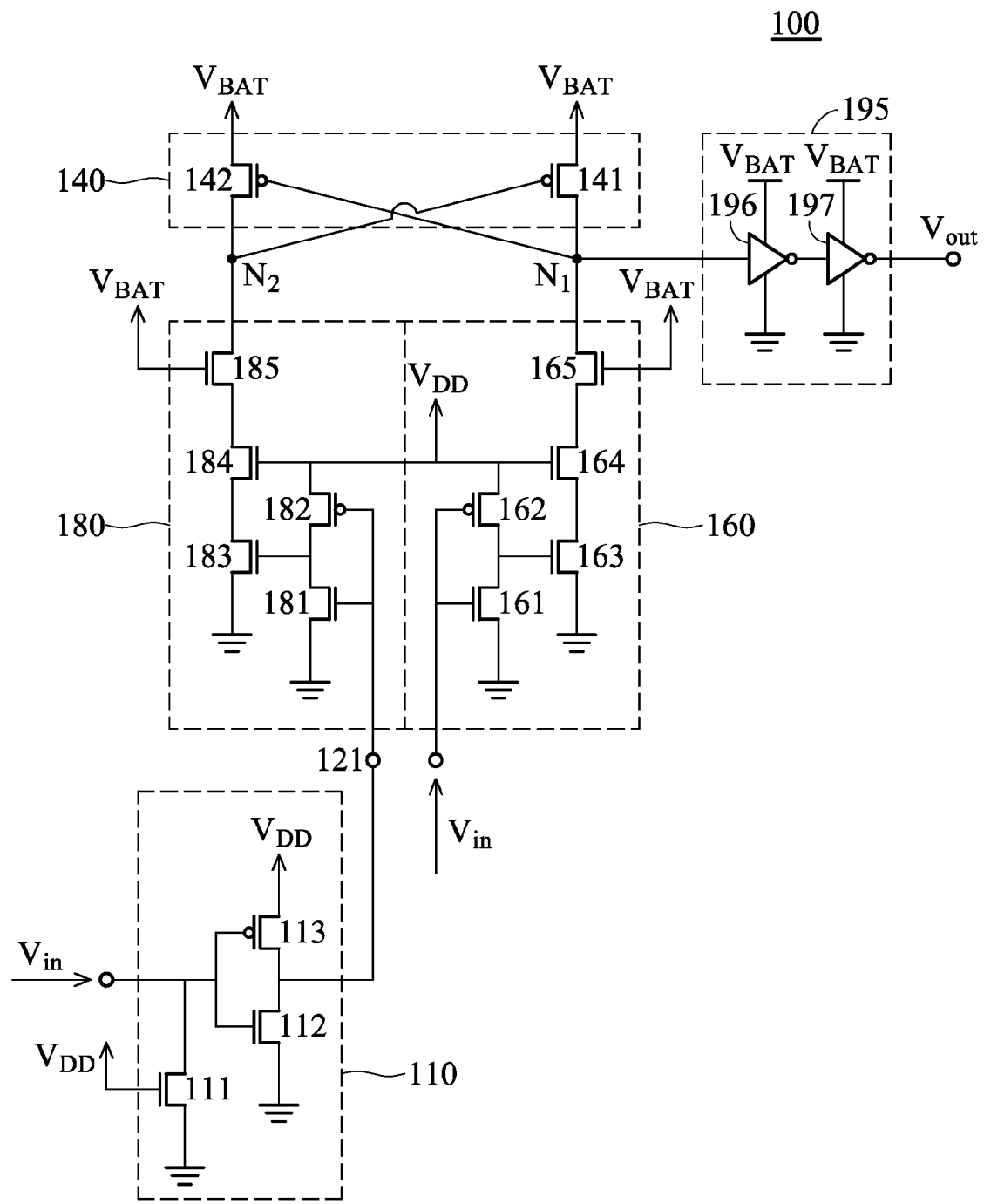
FIG. 1 is a schematic diagram of conventional voltage level shifter.
Figure 2:
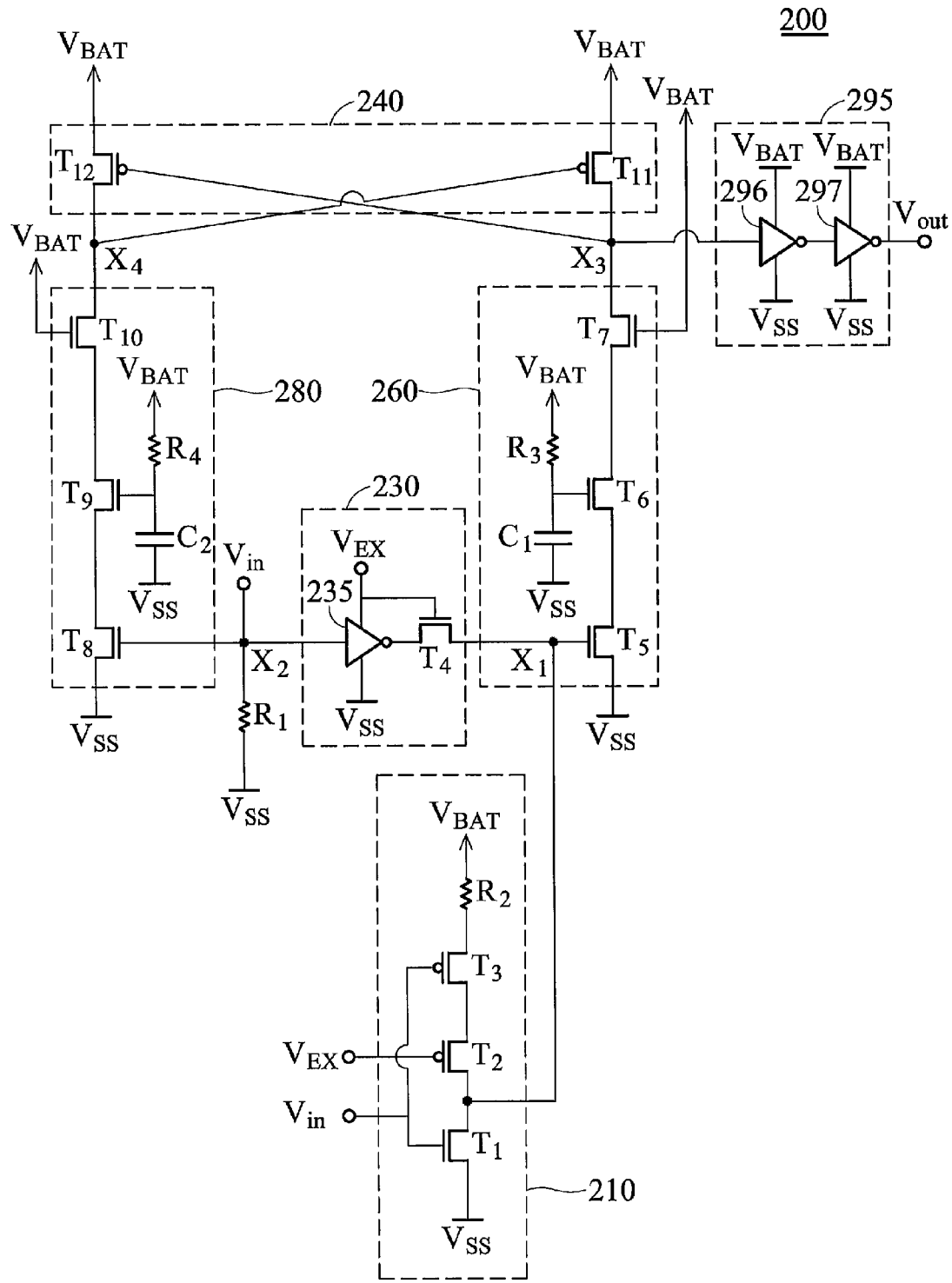
FIG. 2 is a schematic diagram of voltage level shifter according to an embodiment of the invention.

Referring to FIG. 2, a schematic diagram of voltage level shifter 200 according to an embodiment of the invention is shown. Voltage level shifter 200 includes inverting modules 210 and 230, inverting protection circuits 260 and 280, a latch circuit 240 and an output circuit 295.

Inverting module 210 includes a resistor $R_2$, an NMOS transistor $T_1$ and PMOS transistors $T_2$ and $T_3$. Resistor $R_2$ is coupled between PMOS transistor $T_3$ and voltage source $V_{BAT}$. NMOS transistor $T_1$ has a drain coupled to node $X_1$, a gate for receiving an input signal Vin and a source coupled to voltage $V_{SS}$. PMOS transistor $T_2$ has a drain coupled to node $X_1$, a gate coupled to an external signal $V_{EX}$ and a source coupled to a drain of PMOS transistor $T_3$. PMOS transistor $T_3$ has a drain coupled to the source of PMOS transistor $T_2$, a gate coupled to the input signal Vin and a source coupled to one terminal of resistor $R_2$.

Inverting module 230 includes an inverter 235 and an NMOS transistor $T_4$. Inverter 235 has an input terminal coupled to node $X_2$ for receiving the input signal Vin, and an output terminal coupled to NMOS transistor $T_4$. NMOS transistor $T_4$ has a drain coupled to node $X_1$, a gate coupled to the external signal $V_{EX}$, and a source coupled to the output terminal of inverter 235. In addition, resistor $R_1$ is coupled between node $X_2$ and an voltage source $V_{SS}$.

Inverting protection circuit 260 includes NMOS transistors $T_5$, $T_6$ and $T_7$, a resistor $R_3$ and a capacitor $C_1$. NMOS transistor $T_5$ has a drain coupled to NMOS transistor $T_6$, a gate coupled to node $X_1$, and a source coupled to voltage source $V_{SS}$. NMOS transistor $T_6$ has a drain coupled to NMOS transistor $T_7$, a gate coupled to resistor R3 and capacitor C1, and a source coupled to NMOS transistor $T_5$. NMOS transistor $T_7$ has a drain coupled to node $X_3$, a gate coupled to a voltage source $V_{BAT}$ and a source coupled to NMOS transistor $T_6$. Resistor $R_3$ is coupled between the gate of NMOS transistor $T_6$ and the voltage source $V_{BAT}$. Capacitor $C_1$ is coupled between resistor $R_3$ and voltage source $V_{SS}$.

Inverting protection circuit 280 includes NMOS transistors $T_8$, $T_9$ and $T_{10}$, resistor $R_4$ and capacitor $C_2$. NMOS transistor $T_8$ has a drain coupled to NMOS transistor $T_6$, a gate coupled to node $X_2$ and a source coupled to voltage source $V_{SS}$. NMOS transistor $T_9$ has a drain coupled to NMOS transistor $T_{10}$, a gate coupled to resistor $R_4$ and capacitor $C_2$, and a source coupled to NMOS transistor $T_8$. NMOS transistor $T_{10}$ has a drain coupled to node $X_4$, a gate coupled to voltage source $V_{BAT}$ and a source coupled to NMOS transistor $T_9$. Resistor $R_4$ is coupled between the gate of NMOS transistor $T_9$ and voltage source $V_{BAT}$. Capacitor $C_2$ is coupled between resistor $R_4$ and voltage $V_{SS}$.

Latch circuit 240 includes PMOS transistors $T_{11}$ and $T_{12}$. PMOS transistor $T_{11}$ has a drain coupled to node $X_3$, a gate coupled to node $X_4$ and a source coupled to voltage source $V_{BAT}$. PMOS transistor $T_{12}$ has a drain coupled to node $X_4$, a gate coupled to node $X_3$ and a source coupled to voltage source $V_{BAT}$. Output circuit 295 includes two inverters 296 and 297. Inverter 296 coupled between voltage source $V_{BAT}$ and voltage source $V_{SS}$ and having an input terminal coupled to node $X_3$ and an output terminal coupled to inverter 297. Inverter 297 coupled between voltage source $V_{BAT}$ and voltage source $V_{SS}$ and having an input terminal coupled to inverter 296 and an output terminal to an output signal Vout.

In the present invention, assume the ranges of input signal Vin and external signal $V_{EX}$ are 0V~0.9V (or 0V~1.2V), voltage source $V_{BAT}$ is substantially equal to 3.3V, and voltage source $V_{SS}$ is a ground voltage. As a result, output signal Vout is ranged from 0V to 3.3V. According to the operations of voltage level shifter 200 in the present invention, output signal Vout is at low voltage level (i.e. 0V) while input signal Vin is at low voltage level (i.e. 0V); moreover, output signal Vout is at high voltage level (i.e. 3.3V) while input signal Vin is at high voltage level (i.e. 0.9V). Four operating embodiments will be described in more detail set below.

Referring to FIG. 2, for the first embodiment of the present invention, assume that external signal VEX and input signal Vin are both at high voltage level (i.e. 0.9V). Therefore, node $X_2$ is at high voltage level, NMOS transistor $T_8$ turns on, NMOS transistor $T_4$ turns on, NMOS transistor $T_1$ turns on and node $X_1$ is at low voltage level. Then, NMOS transistor $T_5$ turns off. In addition, voltage source $V_{BAT}$ is at high voltage level (i.e. 3.3V) and biases the gates of NMOS transistors $T_6$, $T_7$, $T_9$ and $T_{10}$; as a result, NMOS transistors $T_6$, $T_7$, $T_9$ and $T_{10}$ are turned on. Consequentially, node $X_4$ is at low voltage level, PMOS transistor $T_{11}$ turns on and node $X_3$ is at high voltage level ($V_{BAT}$). Output circuit 295 receives an input signal with a high voltage level from node $X_3$ and then outputs an output signal Vout with a high voltage level (i.e. 3.3V) accordingly.

Referring to FIG. 2, for the second embodiment of the present invention, assume that external signal $V_{EX}$ is high voltage level (i.e. 0.9V) and input signal Vin is at low voltage level (i.e. 0V). Therefore, node $X_2$ is at low voltage level, NMOS transistor $T_8$ turns off, NMOS transistor $T_4$ turns on and node $X_1$ is at high voltage level. Then, NMOS transistor $T_5$ turns on. Voltage source $V_{BAT}$ is at high voltage level (i.e. 3.3V) and biases the gates of NMOS transistors $T_6$, $T_7$, $T_9$ and $T_{10}$; as a result, NMOS transistors $T_6$, $T_7$, $T_9$ and $T_{10}$ are turned on. Consequentially, node $X_3$ is at low voltage level, PMOS transistor $T_{12}$ turns on and node $X_4$ is at high voltage level (i.e. $V_{BAT}$). Output circuit 295 receives an input signal with a low voltage level from node $X_3$ and then outputs an output signal Vout with a low voltage level (i.e. 0V) accordingly.

Referring to FIG. 2, for the third embodiment of the present invention, assume that external signal $V_{EX}$ is at low voltage level (i.e. 0V) and input signal Vin is at high voltage level (i.e. 0.9V). Therefore, node $X_2$ is at high voltage level, NMOS transistor $T_8$ turns on, NMOS transistor $T_4$ turns off, NMOS transistor $T_1$ turns on and node $X_1$ is at low voltage level. Then, NMOS transistor $T_5$ turns off. Voltage source $V_{BAT}$ is at high voltage level (i.e. 3.3V) and biases to gates of NMOS transistors $T_6$, $T_7$, $T_9$ and $T_{10}$; as a result, NMOS transistors $T_6$, $T_7$, $T_9$ and $T_{10}$ are turned on. Node $X_4$ is at low voltage level. PMOS transistor $T_{11}$ is turned on. Consequentially, node $X_3$ is at high voltage level (i.e. $V_{BAT}$). Output circuit 295 receives an input signal with high voltage level signal from node $X_3$ and then outputs an output signal Vout with high voltage level (i.e. 3.3V) accordingly.

Referring to FIG. 2, for the fourth embodiment of the present invention, assume that external signal $V_{EX}$ and input signal Vin are both at low voltage level (i.e. 0V). Therefore, node $X_2$ is at low voltage level, NMOS transistor $T_8$ turns off, NMOS transistor $T_4$ turns on, NMOS transistors $T_2$ and $T_3$ also turn on and node $X_1$ is at high voltage level. Then, NMOS transistor $T_5$ turns on. Voltage source $V_{BAT}$ is at high voltage level (i.e. 3.3V) and biases to gates of NMOS transistors $T_6$, $T_7$, $T_9$ and $T_{10}$; as a result, NMOS transistors $T_6$, $T_7$, $T_9$ and $T_{10}$ are turned on. Consequentially, node $X_3$ is at low voltage level, PMOS transistor $T_{12}$ turns on, node $X_4$ is at high voltage level (i.e. $V_{BAT}$). Output circuit 295 receives an input signal with low voltage level signal from node $X_3$ and then outputs an output signal Vout with a low voltage level (i.e. 0V) accordingly.

Table 1 shows the four embodiments according to the above descriptions. As shown in Table 1, regardless of the voltage level of external signal $V_{EX}$, the voltage level shifter 200 can normally output the output signal Vout according to the input signal Vin. In other words, the voltage level of output signal Vout would follow the voltage level of input signal Vin. Thus, while an input signal Vin with low voltage level is inputted to voltage level shifter 200, an output signal Vout with low voltage level is consequentially outputted. While an input signal Vin with high voltage level is inputted into voltage level shifter 200, an output signal Vout with high voltage level is consequentially outputted. Comparing to the conventional voltage level shifter 100, while voltage source $V_{DD}$ is at low voltage level, current leakage of inverters 196 and 197 would occur due to a floating node N1 of voltage level shifter 100.

TABLE 1

| Intput signal (Vin) | High | Low | High | Low |
|---|---|---|---|---|
| External signal ($V_{EX}$) | High | High | Low | Low |
| Output signal (Vout) | $V_{BAT}$ | Vss | $V_{BAT}$ | Vss |
| Node $X_1$ | Vss | $V_{BAT}$ | Vss | $V_{BAT}$ |
| Node $X_2$ | Vin | Vin | Vin | Vin |
| Node $X_3$ | $V_{BAT}$ | Vss | $V_{BAT}$ | Vss |
| Node $X_4$ | Vss | $V_{BAT}$ | Vss | $V_{BAT}$ |

While the invention has been described by way of example and in terms of preferred embodiments, it is to be understood that the invention is not limited to thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A voltage level shifter for converting an input signal into an output signal, comprising
    a first inverting module coupled between an input terminal and a first node for receiving an external signal and the input signal from the input terminal and providing a first signal at the first node;
    a second inverting module coupled between the first node and a second node for receiving the external signal and the input signal and providing the first signal at the first node;
    a first inverting protection circuit coupled between the first node and a third node for receiving the first signal and providing a second signal at the third node;
    a second inverting protection circuit coupled between the second node and a fourth node for receiving the input signal and providing a third signal at the fourth node;
    a latch circuit coupled between the third node and the fourth node for receiving the second signal and the third signal; and
    an output circuit receiving the second signal and outputting the output signal according to the second signal.

2. The voltage level shifter as claimed in claim 1, wherein when the input signal and the external voltage are both at high voltage level, the first signal and the third signal are at low voltage level, the second signal is at high voltage level and the output signal is at high voltage level.

3. The voltage level shifter as claimed in claim 1, wherein when the input signal and the external voltage are both at low voltage level, the first signal and the third signal are at high voltage level, the second signal is at low voltage level and the output signal is at low voltage level.

4. The voltage level shifter as claimed in claim 1, wherein when the input signal is at low voltage level and the external voltage is at high voltage level, the first signal and the third signal are at high voltage level, the second signal is at low voltage level and the output signal is at low voltage level.

5. The voltage level shifter as claimed in claim 1, wherein when the input signal is at high voltage level and the external voltage is at low voltage level, the first signal and the third signal are at low voltage level, the second signal is at high voltage level and the output signal is at high voltage level.

6. The voltage level shifter as claimed in claim 1 wherein the output circuit comprises a first inverter coupled to a second inverter in series, for sequentially inverting the second signal and outputting the output signal.

7. The voltage level shifter as claimed in claim 1 wherein the first inverting module comprises:
    a first transistor, a second transistor and a third transistor cascaded between a voltage source and a ground voltage; and
    wherein the input signal is respectively applied to gates of the first and the third transistors, the external signal is applied to gate of the second transistor, and the first signal is provided from a junction node of the first transistor and the second transistor.

8. The voltage level shifter as claimed in claim 1 wherein the second inverting module comprises:
    a first inverter receiving the input signal; and
    a first transistor coupled between the first inverter and the first node, the first transistor has a gate for receiving the external signal and provides the first signal at the first node.

9. The voltage level shifter as claimed in claim 1 wherein the first inverting protection circuit comprises:
    a first transistor, a second transistor and a third transistor cascaded between the third node and a ground voltage;
    wherein the first signal from the first node is applied to gate of the first transistor, a voltage source is respectively applied to gates of the second and the third transistors, and the second signal is provided at drain of the third transistor.

10. The voltage level shifter as claimed in claim 1 wherein the second inverting protection circuit comprises:
    an first transistor, a second transistor and a third transistor cascaded between the fourth node and a ground voltage;
    wherein the input signal is applied to gate of the first transistor via the second node, a voltage source is respectively applied to gates of the second and the third transistors, and the third signal is provided at drain of the third transistor.

11. The voltage level shifter as claimed in claim 1 wherein the latch circuit comprises:
    an first transistor having a gate for receiving the third signal from the fourth node, a source coupled to a voltage source and a drain coupled to the first inverting protection circuit via the third node; and
    a second transistor having a gate for receiving the second signal form the third node, a source coupled to the voltage source and a drain coupled to the second inverting protection circuit via the fourth node.

12. The voltage level shifter as claimed in claim 1 wherein the external signal and the input signal are in the range from 0V to 1.2V.

13. The voltage level shifter as claimed in claim 1 wherein the output signal is in the range from 0V to 3.3V.

* * * * *